US008816698B2

(12) United States Patent (10) Patent No.: US 8,816,698 B2
Ganesh et al. (45) Date of Patent: *Aug. 26, 2014

(54) SYSTEM FOR DETECTING FAULTS IN ELECTRICAL WIRING, AND MANUFACTURING METHOD THEREOF

(75) Inventors: Meena Ganesh, Clifton Park, NY (US); David Mulford Shaddock, Troy, NY (US); Selaka Bandara Bulumulla, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 927 days.

This patent is subject to a terminal disclaimer.

(21) Appl. No.: 12/914,066

(22) Filed: Oct. 28, 2010

(65) Prior Publication Data

US 2011/0043219 A1 Feb. 24, 2011

Related U.S. Application Data

(63) Continuation-in-part of application No. 11/687,870, filed on Mar. 19, 2007, now abandoned.

(51) Int. Cl.
*G01R 31/02* (2006.01)
*G01R 31/12* (2006.01)
*G01R 15/18* (2006.01)
*G01R 31/00* (2006.01)

(52) U.S. Cl.
CPC .......... *G01R 31/1272* (2013.01); *G01R 15/186* (2013.01); *G01R 31/008* (2013.01)
USPC ........................................................ 324/543

(58) Field of Classification Search
CPC . G01R 31/1271; G01R 15/186; G01R 31/008
See application file for complete search history.

(56) References Cited

U.S. PATENT DOCUMENTS

| 5,633,648 | A | | 5/1997 | Fischer |
|---|---|---|---|---|
| 5,767,684 | A | * | 6/1998 | Steennis ........................ 324/536 |
| 6,512,444 | B1 | * | 1/2003 | Morris et al. .................. 337/401 |
| 6,801,117 | B2 | * | 10/2004 | Morris et al. .................. 337/401 |
| 6,930,610 | B2 | | 8/2005 | Gao et al. |

(Continued)

FOREIGN PATENT DOCUMENTS

GB 2340224 A 2/2000

OTHER PUBLICATIONS

Ljubomir A. Kojovic; "Split-Core PCB Rogowski Coil Designs and Applications for Protective Relaying"; IEEE 2003; pp. 269-273.

(Continued)

*Primary Examiner* — Jermele M Hollington
(74) *Attorney, Agent, or Firm* — Scott J. Asmus

(57) ABSTRACT

A diagnostic system for detecting faults in electrical wiring, and manufacturing method thereof is provided. The diagnostic system includes a diagnostic sensor coupled to a data acquisition system. The diagnostic sensor includes a sensor housing with a flexible coil sensor disposed inside. The sensor housing includes a base portion, lid portion, and a joining portion, wherein one end of the lid portion is detachably coupled to a first end of the base portion and another end of the lid portion is coupled to a second end of the base portion via the joining portion. The diagnostic sensor further includes a connector coupled to the flexible coil sensor.

24 Claims, 6 Drawing Sheets

(56) References Cited

U.S. PATENT DOCUMENTS

| | | | |
|---|---|---|---|
| 7,145,345 B2 | 12/2006 | Sarkozi et al. | |
| 7,391,220 B2 | 6/2008 | Vallet et al. | |
| 2003/0137392 A1* | 7/2003 | Morris et al. | 337/401 |
| 2008/0231289 A1* | 9/2008 | Ganesh et al. | 324/539 |
| 2010/0253364 A1* | 10/2010 | Ganesh | 324/543 |
| 2010/0332161 A1* | 12/2010 | Bulumulla | 702/58 |
| 2012/0200301 A1* | 8/2012 | Ganesh | 324/537 |

OTHER PUBLICATIONS

S.B. Bulumulla, N.A. Evers; "Flexible, lightweight sensor for monitoring wiring in aircraft"; Presented at the 4th IEEE Conference on Sensors, Irvine, California, Nov. 2005. pp. 4.

International search report; Date of mailing Apr. 3, 2009; application No. PCT/US2008/056561; International Filing date Dec. 3, 2008; pp. 3.

* cited by examiner

SYSTEM FOR DETECTING FAULTS IN ELECTRICAL WIRING, AND MANUFACTURING METHOD THEREOF

CROSS REFERENCE TO RELATED APPLICATIONS

This application is a Continuation-in-part of pending U.S. patent application Ser. No. 11/687,870, entitled "A CLAMPING APPARATUS AND A SYSTEM AND METHOD FOR DETECTING DEFECTS IN ELECTRICAL WIRING", filed Mar. 19, 2007, which is herein incorporated by reference.

STATEMENT REGARDING FEDERALLY SPONSORED RESEARCH & DEVELOPMENT

This invention was made with Government support under contract number N00421-05-D-0116 awarded by NAVAIR. The Government has certain rights in the invention.

BACKGROUND

The invention relates generally to diagnostic systems for electrical wires, and in particular, to a diagnostic system for detecting faults in wires.

Insulation failure in wires used in various applications, for example aircraft industry, is a critical safety concern since discharges from electrical wires may lead to on-board fires or other hazardous conditions. Insulation failure of wires has been primarily attributed to aging of the wires leading to cracks in the insulation. Further, improper installation and handling may also lead to faults in insulation. Initial degradation in the insulation may start with microscopic cracks that result in small electrical discharges. The discharges may further carbonize the insulation leading to a full arc discharge. Hence maintenance of the wiring system is an important factor to the maintenance of the aircraft. However, wiring in a typical aircraft is substantially long, thereby complicating manual inspection for faults.

The need for manual inspection is generally avoided by deploying diagnostic sensors that may acquire electro-magnetic signals occurring due to electrical discharges in an electrical wire. However, existing diagnostic sensors are usually not very effective in detecting small electrical discharges. In order to increase the effectiveness, multiple diagnostic systems are deployed in a wiring system that can detect various magnitudes of electrical discharges. However, sensors in such diagnostic systems are generally associated with a magnetic core, which increases the weight of the diagnostic system and subsequently the weight of the aircraft where such multiple diagnostic systems are deployed. Also, the high currents transmitted by the aircraft wiring can saturate the magnetic core, which renders the sensor ineffective.

There is a need for an improved lightweight diagnostic system for electrical wires that addresses the aforementioned issues.

BRIEF DESCRIPTION

In accordance with an exemplary embodiment disclosed herein, a diagnostic system is provided. The diagnostic system comprises a diagnostic sensor including a sensor housing. The sensor housing further comprises a base portion, a lid portion, and a joining portion wherein one end of the lid portion is detachably coupled to a first end of the base portion and another end of the lid portion is coupled to a second end of the base portion via the joining portion. The sensor housing is configured to receive an electrical wire. The diagnostic system further comprises a flexible coil sensor disposed inside the sensor housing and bonded substantially along the base portion and the joining portion and configured to detect a fault in the electrical wire.

In accordance with an exemplary embodiment disclosed herein, a method for manufacturing a diagnostic sensor is provided. The method includes coupling a second end of a base portion to another end of a lid portion via a joining portion and bonding a flexible coil sensor substantially along the base portion and the joining portion. One end of the lid portion is detachably coupled to a first end of the base portion to form a sensor housing in such a way that the flexible coil sensor is disposed inside the sensor housing.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As discussed in detail below, embodiments of the present invention provide a diagnostic system for detecting faults in an electrical wiring. This invention may, however be, embodied in many different forms and should not be construed as limited to the embodiments set forth herein; rather these embodiments are provided so that this disclosure will be thorough and complete and will fully convey the scope of the invention to those skilled in the art.

Figure 1:
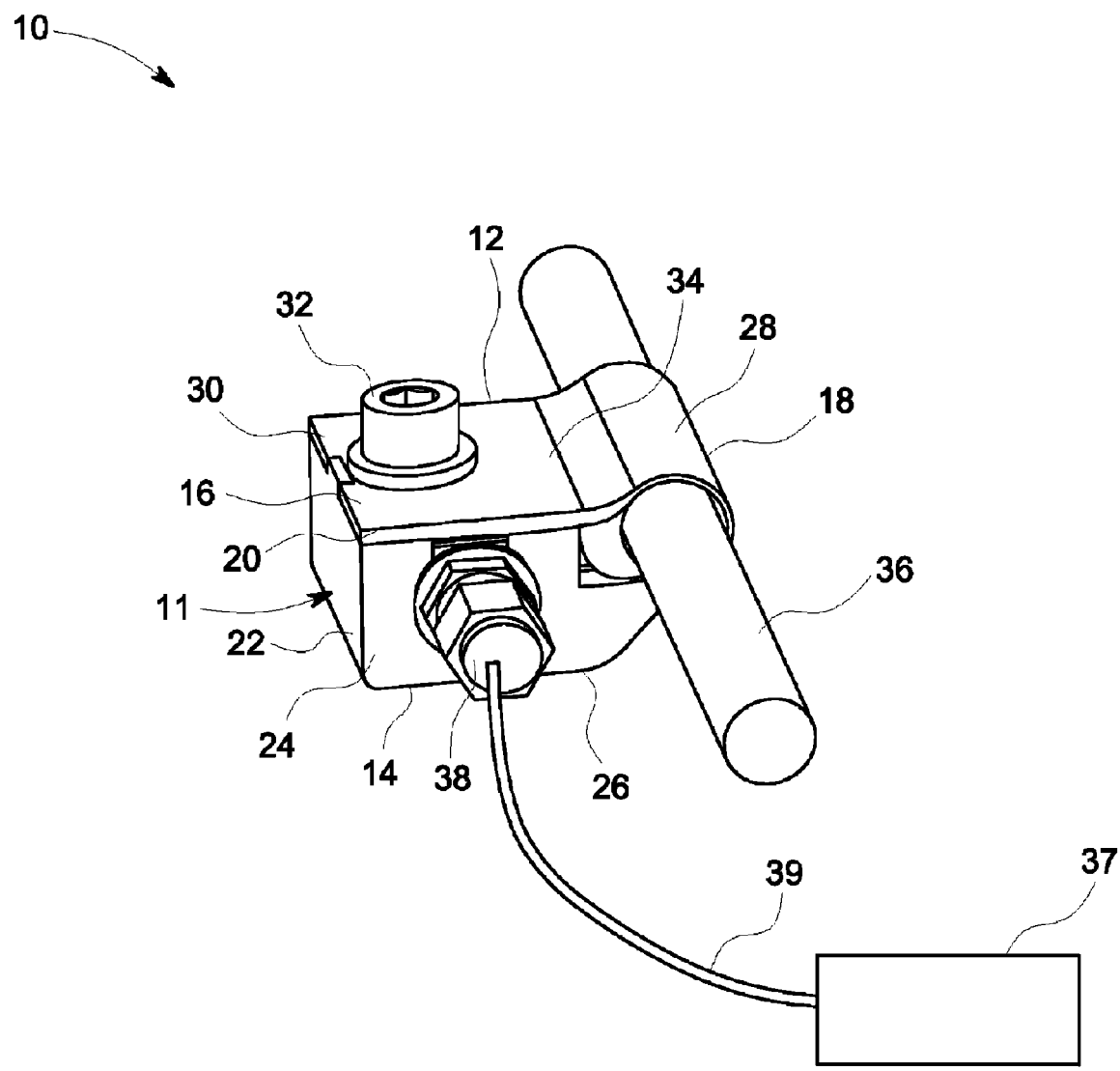
FIG. 1 illustrates a diagnostic system according to an embodiment of the present invention.

FIG. 1 illustrates a diagnostic system 10 according to an embodiment of the present invention. The diagnostic system 10 includes a diagnostic sensor 11, which includes a sensor housing 12, with a flexible coil sensor (not shown) disposed inside. Details of the flexible coil sensor are discussed in conjunction with subsequent figures. The sensor housing 12 includes a base portion 14, a lid portion 16 and a joining portion 18. In the embodiment illustrated in FIG. 1, the lid portion 16 and the base portion 14 have a cuboidal structure 20 and a cuboidal structure 22 respectively. Each of the cuboidal structure 20 and the cuboidal structure 22 is a structure bounded by six faces and associated with a length, a breadth and a height. The length, breadth and height may have a numerical value different from each other. The joining portion 18 comprises a semicircular structure 28 One end 30 of the lid portion 16 is detachably coupled to a first end 24 of the base portion 14 via a nut 32 and screw (not shown) joint. Another end 34 of the lid portion 16 is coupled to a second end 26 of the base portion 14 via the joining portion 18. In a specific embodiment, the sensor housing 12 is a single piece structure. In other embodiments, the base portion 14, the lid portion 16, and the joining portion 18 are manufactured separately and thereafter coupled together in a manner described above. In a specific embodiment, the sensor housing 12 is made of 66 Nylon, a lightweight material associated with high strength.

The sensor housing 12 of the diagnostic sensor 11 is configured to receive an electrical wire 36 or a bundle of wires, which is to be monitored for faults by the diagnostic system 10. The term 'faults', as used herein, refers to electrical discharges in the electrical wire or wires 36 due to reasons such as, a failure in insulation in the electrical wire 36, improper installation, improper handling, and external factors such as temperature and humidity. As the figure illustrates, the joining portion 18 is wrapped around at least a portion of the electrical wire 36. A flexible coil sensor (not shown) disposed inside the sensor housing 10 is configured to detect a fault in the electrical wire or wires 36 as will be discussed in subsequent figures. The diagnostic sensor 11 further includes a connector 38 coupled to the base portion 14 and also to the flexible coil sensor (The coupling between the connector 38 and the flexible coil sensor will be illustrated in subsequent figures).

The diagnostic system 10 further includes a data acquisition system 37 coupled to the connector 38 via a lead 39, which provide an electrical connection between the connector 38 and the data acquisition system 37. When an electric discharge occurs in the electrical wire 36, the resulting magnetic fields induce an electrical signal in the flexible coil sensor. The electrical signal is transmitted, via the connector 38, to the data acquisition system 37. The data acquisition system 37 is configured to analyze the signal to detect the occurrence of fault in the electrical wire 36.

Figure 2:
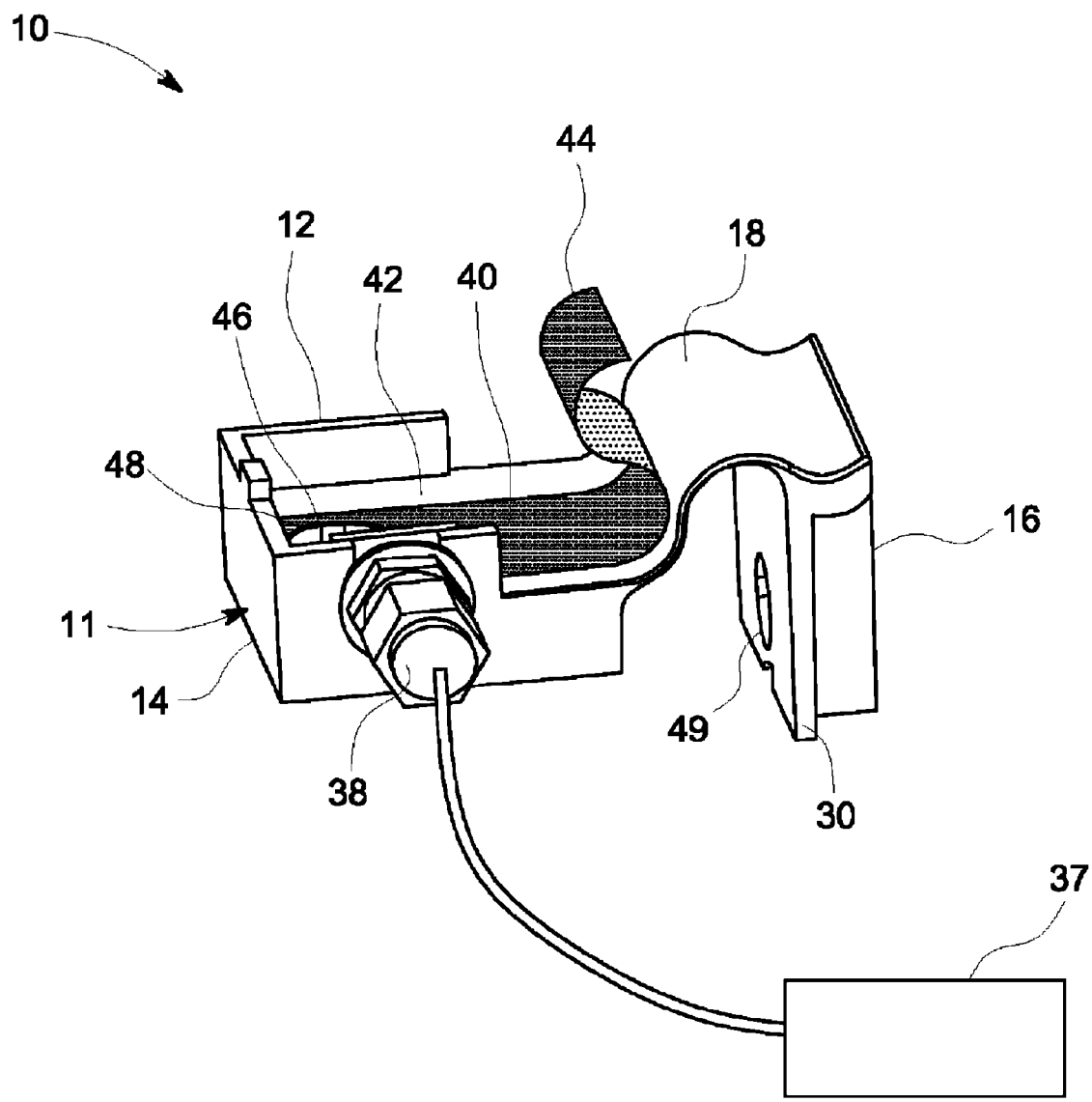
FIG. 2 illustrates a diagnostic system including a sensor housing in an open position, in accordance with an embodiment of FIG. 1.

FIG. 2 illustrates the diagnostic sensor 11 with the sensor housing 12 in an open position in accordance with an embodiment of FIG. 1. As the sensor housing 12 is in an open position, FIG. 2 also illustrates the flexible coil sensor 40, which was not visible in FIG. 1. The sensor housing 12 can be opened by removing the nut 32 and screw joint (illustrated in FIG. 1). In the illustrated embodiment, a flexible coil sensor 40 is bonded substantially along a flat surface 42 of the base portion 14. A portion 44 of the flexible coil sensor 40 is bonded substantially along the joining portion 18 (the diagram does not illustrate actual bonding between the portion 44 and the joining portion 18). In a specific embodiment, the flexible coil sensor 40 is bonded to the flat surface 42 and the joining portion 18 using an adhesive comprising NuSil CF1-3510. In some embodiments of the invention, the flexible coil sensor 40 is also bonded to at least a portion of the lid portion 16. The connector 38 is coupled to the base portion 14 and to the flexible coil sensor 40.

In reference to both FIG. 1 and FIG. 2, the flexible coil sensor 40, the base portion 14, and the lid portion 16 include an opening 46, an opening 48, and an opening 49 respectively. When the sensor housing 12 is in a closed position as illustrated in FIG. 1, the opening 46, the opening 48, and the opening 49 overlap with each other and enable fitting of the nut 32 and screw joint. The one end 30 of the lid portion 16 is detachably coupled to the base portion 14 using the nut 32 and screw joint in such a way that the lid portion 16 overlaps the base portion 14 and the flexible coil sensor 40 is surrounded by the lid portion 16, the joining portion 18, and the base portion 14. Further, as the flexible coil sensor 40 is bonded to the joining portion 18, the flexible coil sensor 40, along with the joining portion 18, is wrapped around at least a portion of the electrical wire 36 when the sensor housing is in a closed position as illustrated in FIG. 1. The flexible coil sensor 40 is configured to detect a fault such as an electrical discharge in the electrical wire 36 and generate a corresponding electrical signal, which is transmitted to the data acquisition system 37 via the connector 38.

Figure 3:
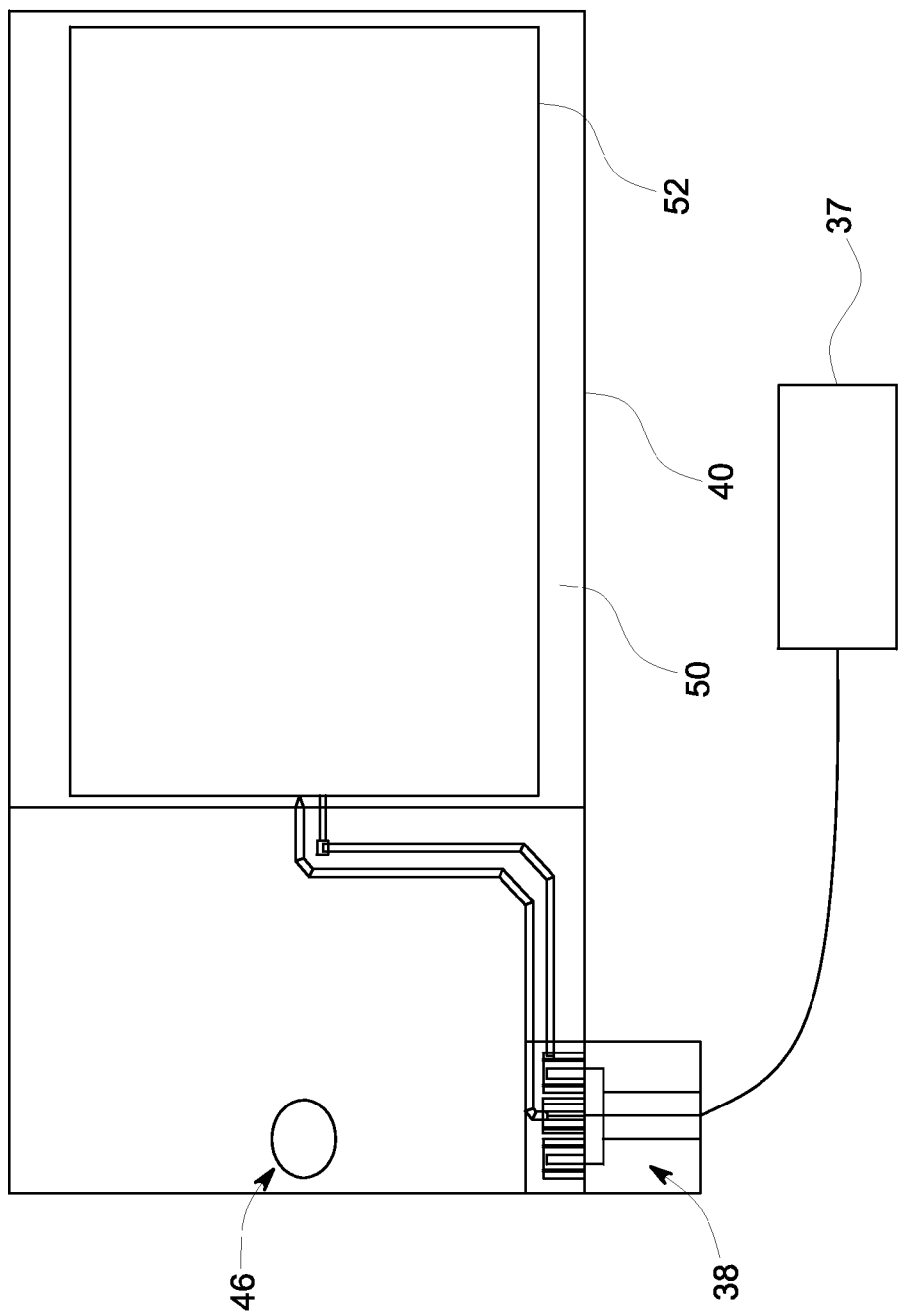
FIG. 3 illustrates a flexible coil sensor coupled to a connector in accordance with an embodiment of FIGS. 1 and 2.

FIG. 3 illustrates the flexible coil sensor 40 coupled to the connector 38 in accordance with an embodiment of FIGS. 1 and 2. The flexible coil sensor 40 includes a substrate 50 having a coil shaped pattern 52 etched on the substrate 50. Details of the coil shaped pattern 52 are discussed in conjunction with FIG. 4. In a specific embodiment, the connector 38 is a co-axial radio frequency connector such as a subminiature version A (SMA) connector or a Bayonet Neill-Concelman connector (BNC) and is coupled to the substrate 50 via soldering using Sn 3.5 Ag. The substrate 50 includes the opening 46 as discussed in conjunction with FIGS. 1 and 2.

In reference to both FIGS. 1 and 3, when an electric discharge occurs in the electrical wire 36, the resulting magnetic fields induce an electrical signal in the flexible coil sensor 40. The electrical signal is transmitted, via the connector 38, to the data acquisition system 37, which analyzes the electrical signal to identify the occurrence of fault in the electrical wire 36.

Figure 4:
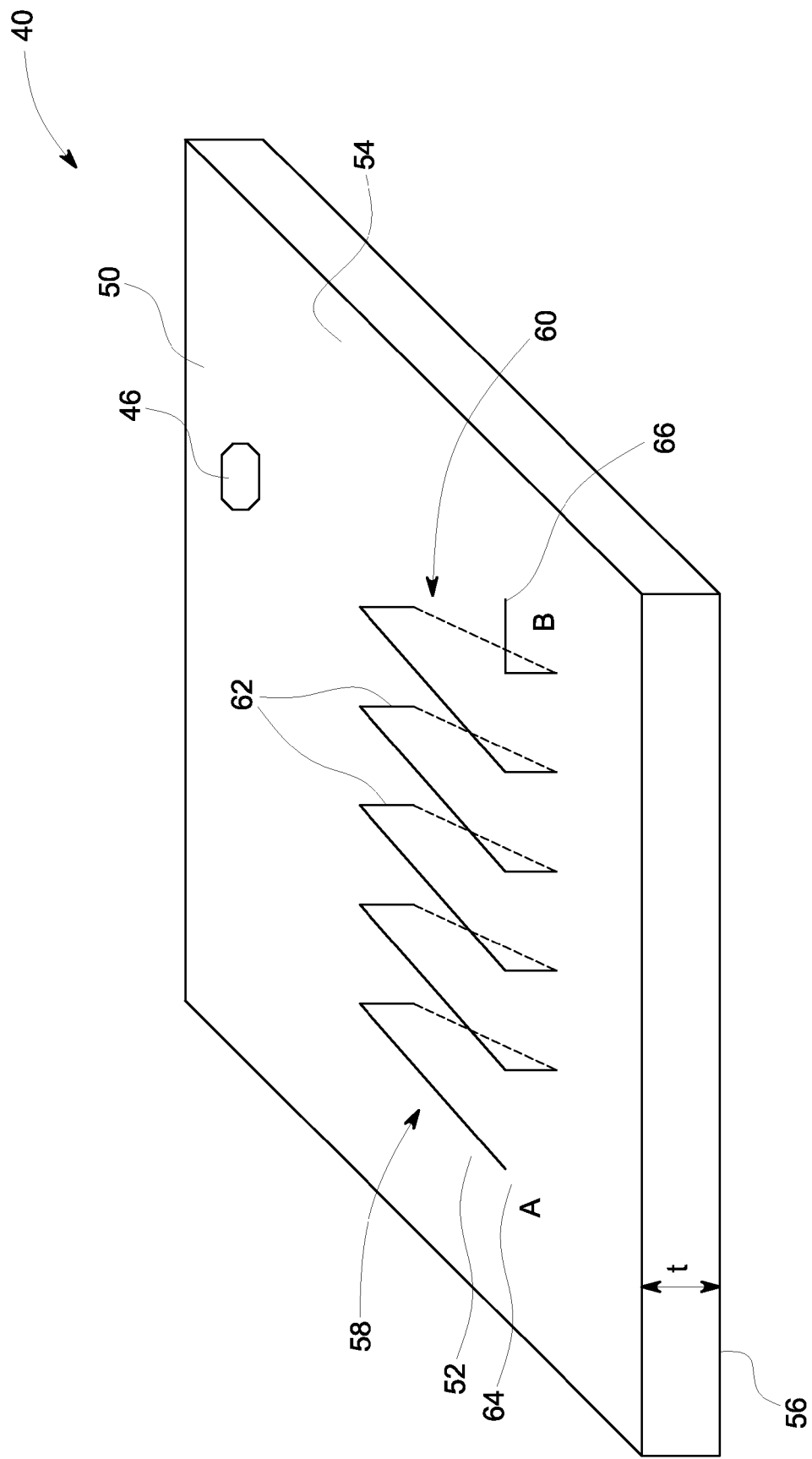
FIG. 4 illustrates a coil type pattern in a flexible coil sensor in accordance with an embodiment of FIGS. 1-3.

FIG. 4 illustrates the coil type pattern 52 in the flexible coil sensor 40 in accordance with an embodiment of FIGS. 1-3. The flexible coil sensor 40 includes the substrate 50 having the coil shaped pattern 52 etched on the substrate 50. In a specific embodiment, the substrate 50 is made of Upilex-S, which is a heat resistance polyimide film covered by a layer of copper, and made by Ube Industries (Japan). Upilex-S is associated with low moisture absorption, leading to better reliability over longer time in an aircraft environment where the humidity level may be high. In another embodiment, the substrate 50 is made of Espanex, manufactured by Nippon Steel Chemical Company Limited. In an embodiment, the substrate 50 has a thickness t in a range of about 5 mils and about 10 mils (1 mil=25.4 micrometer). Further, in a specific embodiment, the weight of the flexible coil sensor 40 is in a range of about 0.2 grams to about 1 gram. It is to be noted that the above properties of the substrate and the absence of a magnetic core makes the flexible coil sensor 40 very effective to be used in an aircraft as multiple such diagnostic sensors can be deployed in an aircraft without substantially increasing the weight of the aircraft or the risk of sensor becoming ineffective due to saturation of the magnetic core.

The coil shaped pattern 52 is etched on a surface 54 and a surface 56 of the substrate 50. In some embodiments, the coil shaped pattern 52 comprises a first portion 58 etched on the surface 54 and a second portion 60 etched on the surface 56. The first portion 58 and the second portion 60 are coupled through a plurality of vias 62. The coil shaped pattern 52 further comprises an end 64 and an end 66, which are coupled to the connector 38 (illustrated in FIG. 3). It should be noted that the coil shaped pattern 52 as illustrated in FIG. 2 is exemplary and numerous variations are possible in etching the coil shaped pattern 52 on the substrate 50 as will be evident to a person skilled in the art.

Figure 5:
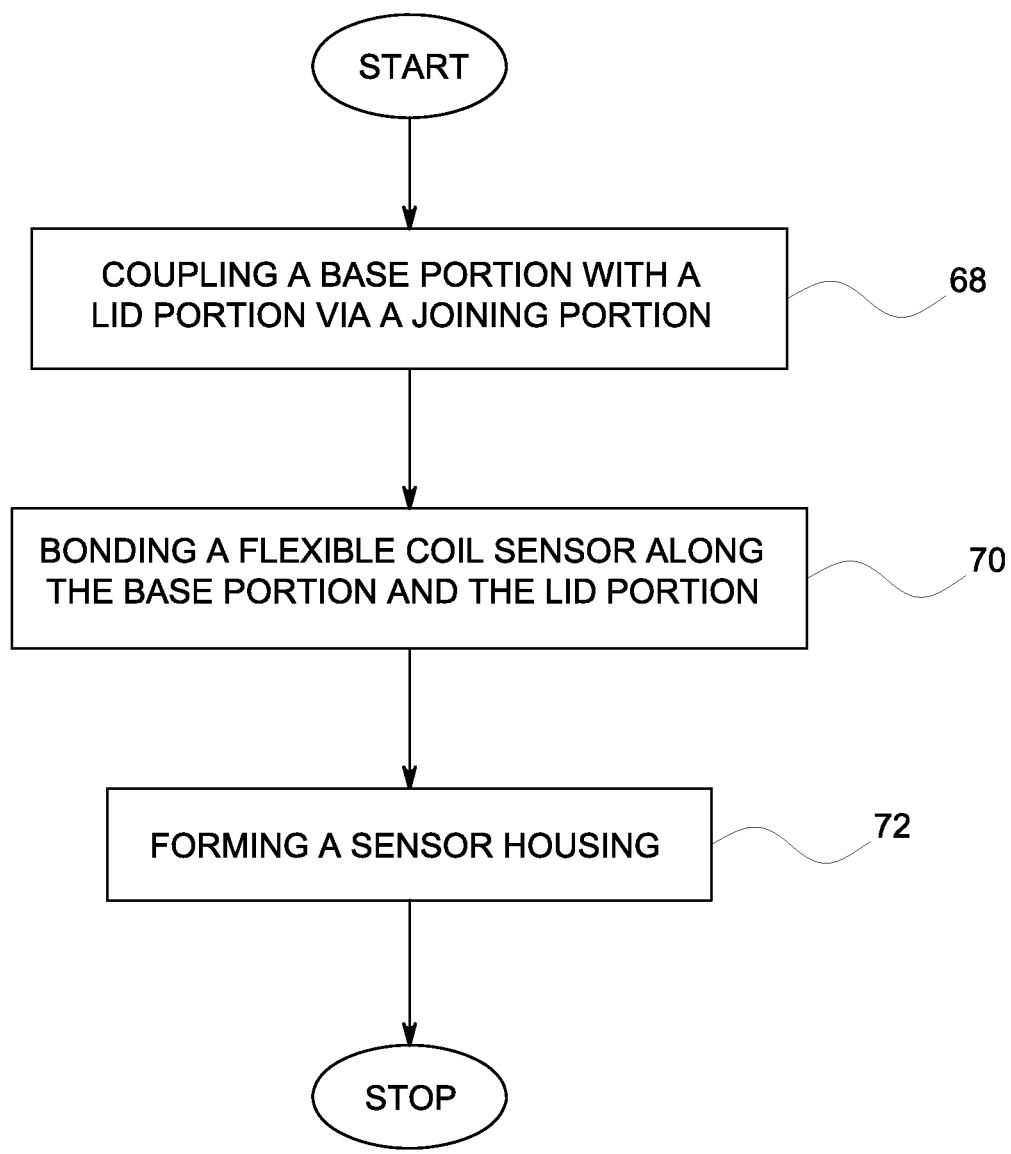
FIG. 5 is a flow diagram illustrating a process of manufacturing a diagnostic sensor in accordance with an embodiment of the present invention.

FIG. 5 is a flow diagram described in conjunction with FIGS. 1 and 2. The diagram illustrates a process of manufacturing the diagnostic sensor 11. At step 68, the base portion 14 is coupled to the lid portion 16 via the joining portion 18. According to some embodiment, the sensor housing 12 is prepared by molding and is a single piece structure. In other embodiments, various coupling means can be used to couple the base portion 14 to the joining portion 18 and the joining portion 18 to the lid portion 16 in the manner as illustrated in FIGS. 1 and 2.

At step 70, the flexible coil sensor 40 is bonded substantially along the base portion 14 and the joining portion 18. In a specific embodiment, the flexible coil sensor 40 is bonded along the base portion 14 and the joining portion 18 using an adhesive comprising NuSil CF1-3510, which is a flourosilicon silicone system. In some embodiments, other adhesives including urethanes, epoxies, acrylics, silicones and their combinations can be used. For bonding, a mixture of two components of NuSil CF1-3510—about 10 grams of CF1-3510 (red) and about 11 grams of CF1-3510 (white) is prepared. The mixture is coated to the surface 56 of the flexible coil sensor 40, to the flat surface 42 of the base portion 14, and to the joining portion 18. The flexible coil sensor 40 is thereafter disposed in the sensor housing 12 by bonding the flexible coil sensor 40 to the flat surface 42 and the joining portion 18 and the coating is left to dry for about thirty minutes. The open sensor housing 12 is wrapped around a steel rod (an exemplary test specimen in place of an electrical wire) and is closed by detachably coupling the one end 30 of the lid portion 16 to the first end 24 of the base portion 14 via the nut 32 and a screw. The closed sensor housing 12 with the steel rod is cured in an oven for about 30 minutes. Thereafter, the sensor housing 12 is removed from the oven and is opened by removing the nut 32. The steel rod is then removed. The above mentioned process bonds the flexible coil sensor 40 to the base portion 14 and the joining portion 18.

At step 72, the connector 38 is coupled to the flexible coil sensor 40 and also to the base portion 14 to form the diagnostic sensor 11. The diagnostic sensor 11 is placed around the electrical wire 36 and the sensor housing 12 is formed by detachably coupling the one end 30 of the lid portion 16 to the first end 24 of the base portion 14 via a nut 32 and screw (not shown) joint. The coupling results in a housing with the flexible coil sensor 40 disposed inside as illustrated in FIG. 1.

Figure 6:
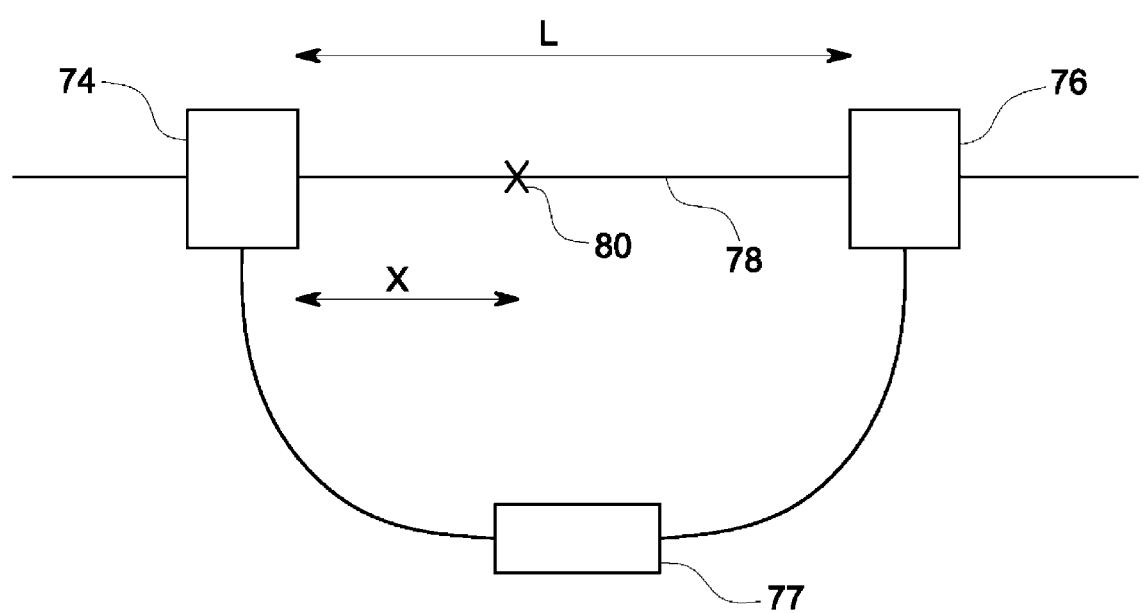
FIG. 6 illustrates a system to determine a location of a fault in an electrical wire using a plurality of diagnostic sensors in accordance with an embodiment of the present invention.

FIG. 6 illustrates a system to calculate a location of a fault in an electrical wire or an electrical wire bundle using a plurality of diagnostic sensors (as illustrated in FIG. 1) in accordance with an embodiment of the invention. The figure illustrates a diagnostic sensor 74 and a diagnostic sensor 76, separated by a distance L, and adjacently wrapped around an electrical wire 78. Each of the diagnostic sensor 74 and the diagnostic sensor 76 is analogous to the diagnostic sensor 11 (illustrated in FIG. 1) and comprises a flexible coil sensor disposed inside a sensor housing, wherein the flexible coil sensor is coupled to a connector as discussed in conjunction with FIG. 1. The diagnostic sensors 74, 76 are coupled to a data acquisition system 77. The data acquisition system 77 is analogous to the data acquisition system 37 illustrated in FIG. 1. The diagnostic sensors 74, 76 configuration details, which include the distance L, are stored in the data acquisition system 77. The figure also illustrates a fault location 80 in the electrical wire 78 where a fault, for example, a partial discharge has occurred. The fault location 80 is at a distance x from the diagnostic sensor 74. When a partial discharge occurs at fault location 80, two electrical pulses propagate from the fault location 80, along the electrical wire 78, towards the diagnostic sensors 74, 76. The velocity v of the electrical pulses depends on the type of electrical wire 80 and v is usually in a range of about 60% to about 90% of the speed of light. In a specific embodiment, the velocity v is equal to 0.6 times the speed of light. After the occurrence of fault, the time $t_1$ taken by the pulse to reach diagnostic sensor 74 is given by:

$$t_1 = x/v;$$

Similarly, time $t_2$ taken by the pulse to reach diagnostic sensor 76 is given by:

$$t_2 = (L-x)/v;$$

The time difference between the pulses received by diagnostic sensors 74, 76 is given by:

$$t_2 - t_1 = (L - 2*x)/v;$$

The electrical pulses induce electrical signals in the flexible coil sensors in the diagnostic sensors 74, 76 that are transmitted to the data acquisition system 77. Upon receiving the electrical signal, the data acquisition system 77 gets an indication of the occurrence of fault and based on the time difference $t_2 - t_1$ of the electrical signals received from the diagnostic sensors 74, 76, the data acquisition system 77 can calculate the distance x of the fault location 80 from the diagnostic sensor 74 using the above equations.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A diagnostic system, comprising:
   a sensor housing configured to receive an electrical wire, the sensor housing comprising:
   a base portion;
   a lid portion;
   a joining portion being wrapped around at least a portion of the electrical wire; wherein one end of the lid portion is detachably coupled to a first end of the base portion and another end of the lid portion is coupled to a second end of the base portion via the joining portion; and
   a flexible coil sensor disposed in the sensor housing, bonded substantially along the base portion and the joining portion and configured to detect a fault in the electrical wire, wherein the flexible coil sensor comprises a substrate and a coil shaped pattern etched on the substrate.

2. The diagnostic system of claim 1, wherein the sensor housing is a single piece structure.

3. The diagnostic system of claim 1, wherein the sensor housing comprises 66 nylon.

4. The diagnostic system of claim 1, wherein the one end of the lid portion is detachably coupled to the first end of the base portion in such a way that the lid portion overlaps the base portion and the flexible coil sensor is surrounded between the lid portion, the joining portion, and the base portion.

5. The diagnostic system of claim 1, wherein the base portion comprises a cuboidal structure.

6. The diagnostic system of claim 1, wherein the joining portion comprises a semicircular structure.

7. The diagnostic system of claim 1, wherein the lid portion comprises a cuboidal structure.

8. The diagnostic system of claim 1, wherein the flexible coil sensor is wrapped around at least a portion of the electrical wire.

9. The diagnostic system of claim 1, wherein the flexible coil sensor is bonded substantially along a flat surface of the base portion and the joining portion using an adhesive.

10. The diagnostic system of claim 9, wherein the adhesive comprises NuSil CF1-3510.

11. The diagnostic system of claim 1, wherein the flexible coil sensor is bonded to at least a portion of the lid portion.

12. The diagnostic system of claim 1, wherein the coil shaped pattern comprises a first portion etched on one surface of the substrate and a second portion etched on another surface of the substrate.

13. The diagnostic system of claim 12, wherein the first portion is coupled to the second portion through a plurality of vias.

14. The diagnostic system of claim 1, wherein the substrate comprises a polyimide film.

15. The diagnostic system of claim 1 further comprises a connector coupled to the sensor housing.

16. The diagnostic system of claim 15, wherein the connector is coupled to the base portion of the sensor housing and communicatively coupled to the flexible coil sensor to receive an electrical signal from the flexible coil sensor.

17. The diagnostic system of claim 16, wherein the connector is soldered to the flexible coil sensor using SnAg3.5.

18. The diagnostic system of claim 17 further comprises a data acquisition system configured to:
   receive the electrical signal from the connector; and
   analyze the electrical signal to detect the fault in the electrical wire.

19. The diagnostic system of claim 18, wherein the data acquisition system is configured to determine a fault location of the fault in the electrical wire.

20. The diagnostic system of claim 19, wherein the fault location includes distance of the fault from the sensor housing.

21. A method, comprising:
   coupling a second end of a base portion to another end of a lid portion via a joining portion;
   bonding a flexible coil sensor comprising a substrate and a coil shaped pattern etched on the substrate, substantially along the base portion and the joining portion; and
   coupling one end of the lid portion detachably to a first end of the base portion to form a sensor housing in such a way that the flexible coil sensor is disposed inside the sensor housing.

22. The method of claim 21, comprising bonding the flexible coil sensor substantially along the base portion and the joining portion using an adhesive.

23. The method of claim 21, further comprising bonding the flexible coil sensor along at least a portion of the lid portion.

24. The method of claim 21, comprising coupling the one end of the lid portion detachably to the first end of the base portion through a screw and nut mechanism.

\* \* \* \* \*